United States Patent
Brunn et al.

(10) Patent No.: US 7,142,622 B1
(45) Date of Patent: Nov. 28, 2006

(54) MULTIPLYING PHASE DETECTOR FOR USE IN A RANDOM DATA LOCKED LOOP ARCHITECTURE

(75) Inventors: Brian T. Brunn, Austin, TX (US); Ahmed Younis, Austin, TX (US)

(73) Assignee: XILINX, Inc., San Jose, CA (US)

( * ) Notice: Subject to any disclaimer, the term of this patent is extended or adjusted under 35 U.S.C. 154(b) by 778 days.

(21) Appl. No.: 10/421,248

(22) Filed: Apr. 22, 2003

(51) Int. Cl.
   *H03D 3/24* (2006.01)
(52) U.S. Cl. ............................ 375/375; 375/376
(58) Field of Classification Search .............. 375/327, 375/375, 376; 327/156–159; 331/1 R, 25, 331/1 A
   See application file for complete search history.

(56) References Cited

U.S. PATENT DOCUMENTS

| | | | | |
|---|---|---|---|---|
| 4,320,345 A | * | 3/1982 | Waggener | ............ 329/307 |
| 6,411,661 B1 | * | 6/2002 | Nguyen et al. | ............ 375/336 |
| 6,603,803 B1 | * | 8/2003 | Hatch | ............ 375/150 |
| 2002/0048107 A1 | * | 4/2002 | Bryant et al. | ............ 360/51 |
| 2004/0202266 A1 | * | 10/2004 | Gregorius et al. | ............ 375/355 |

* cited by examiner

*Primary Examiner*—Don N. Vo
(74) *Attorney, Agent, or Firm*—Timothy Markison

(57) ABSTRACT

A multiplying phase detector includes a $1^{st}$ multiplier, a $2^{nd}$ multiplier and a phase error generation module. The $1^{st}$ multiplier is operably coupled to multiple an incoming data stream, which is a random data pattern, with a $1^{st}$ clock, which is in-phase with the incoming stream of data and is one-half the rate of the incoming stream of data, to produce a $1^{st}$ product. In this instance, the $1^{st}$ product represents missing transitions in the incoming stream of data. The $2^{nd}$ multiplier is operably coupled to multiply the $1^{st}$ product with the incoming data stream to produce a modified stream of data. The phase error generation module is operably coupled to generate a phase error based on the modified stream of data and a $2^{nd}$ clock, where the phase error represents a phase offset between the modified stream of data and the $2^{nd}$ clock.

24 Claims, 5 Drawing Sheets high-speed, wide bandwidth data
detection circuit 10 phase detection module 22 phase detection module 22 phase detection module 22 phase detection module 22 phase detection module 22 phase detection module 22 timing diagram of phase detector modules of FIG.s 2-4 timing diagram of phase detector modules of FIG.s 5-7

MULTIPLYING PHASE DETECTOR FOR USE IN A RANDOM DATA LOCKED LOOP ARCHITECTURE

BACKGROUND OF THE INVENTION

1. Technical Field of the Invention

This invention relates generally to data communication systems and more particularly to data and/or clock recovery circuits used within such communication systems.

2. Description of Related Art

Communication systems are known to transport large amounts of data between a plurality of end user devices, which, for example, include telephones, facsimile machines, computers, television sets, cellular telephones, personal digital assistants, etc. As is also known, such communication systems may be local area networks (LANS) and/or wide area networks (WANs) that are stand-alone communication systems or interconnected to other LANs and/or WANs as part of a public switched telephone network (PSTN), packet switched data network (PSDN), integrated service digital network (ISDN), the Internet, etc. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is typically governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Another standard, which is for fiber optic data conveyances, is Synchronous Optical NETwork (SONET) that provides a data rate of 10 gigabits per second. In accordance with such standards, many system components and end user devices of a communication system transport data via serial transmission paths. Internally, however, the system components and end user devices process data in a parallel manner. As such, each system component and end user device must receive the serial data and convert the serial data into parallel data without loss of information.

Accurate recovery of information from high-speed serial transmissions typically requires transceiver components to operate at clock rates that are equal to or higher than the rate of the received serial data, which, for today's high-speed systems, requires very high clock rates. Such high clock rates limit the usefulness of prior art clock and data recovery circuits since such clock and data recovery circuits require precise alignment of the received serial data with the high-speed clock to recover an embedded clock signal in the data stream and/or to recover the data, which is difficult to achieve using today's integrated circuit fabrication techniques. In addition, the high-speed serial data requires the clock and data recovery circuits to have a bandwidth wide enough to handle the high-speed serial data, which is also difficult to achieve using today's integrated circuit fabrication techniques.

As the demand for data throughput increases, so do the demands for a low bit error rate, high-speed serial transceivers (i.e., a transmitter and a receiver, where the receiver includes a clock and data recovery circuit). The increased throughput demands are pushing some current integrated circuit manufacturing processes to their operating limits, where integrated circuit processing limits (e.g., device parasitics, trace sizes, propagation delays, device sizes, etc.) and integrated circuit (IC) fabrication limits (e.g., IC layout, frequency response of the packaging, frequency response of bonding wires, etc.) limit the speed at which the high-speed serial transceiver, and particularly the clock and data recovery circuit, may operate without excessive jitter and/or noise.

As is further known, a data detection and/or clock recovery circuit (or clock and data recovery circuit) has a phase locked loop (PLL) topology. Many data detection and/or clock recovery circuits include a phase detector, a charge pump circuit, a loop filter, a voltage controlled oscillator, a feedback circuit, and a coarse locked loop to establish an initial frequency for the overall circuit. Once the coarse locked loop has established the initial frequency, it is disabled and the remaining components of the data detection and clock recovery circuit are activated.

In this mode, the phase detector determines phase differences between an incoming stream of data and a feedback signal. The phase detector also produces the recovered data from the incoming stream of data and a recovered clock. The charge pump circuit converts the phase differences produced by the phase detector into a current signal. The loop filter converts the current signal into a controlled voltage that is provided to the voltage controlled oscillator. The voltage controlled oscillator generates a recovered clock based on the control voltage. The feedback circuit produces the feedback signal by dividing the recovered clock by a divider value, which may be one.

The phase detector is generally implemented as a logic phase detection circuit that detects a phase difference between the incoming data stream and the feedback signal. While there are other embodiments of phase detectors, in particular, multiplying phase detectors, they are not used in data detection and/or clock recovery circuits because of the randomness of the incoming data stream. As is known, a multiplying phase detector requires its two inputs, i.e., a feedback signal and an input signal, to have transitions at every clock boundary to function properly. In other words, a multiplying phase detector requires that its input be non-random to function properly.

For high-speed applications that can provide non-random signals to the phase detector (e.g., a phase locked loop), multiplying phase detectors are preferred over logic gate phase detectors because they are faster and lower the overall gain requirement of the circuit.

Therefore, a need exists for a multiplying phase detector for use in a random data locked loop architecture.

BRIEF SUMMARY OF THE INVENTION

A multiplying phase detector for use in a random data locked loop architecture of the present invention substantially meets these needs and others. In one embodiment, a multiplying phase detector includes a $1^{st}$ multiplier, a $2^{nd}$ multiplier and a phase error generation module. The $1^{st}$ multiplier is operably coupled to multiply an incoming data stream, which is a random data pattern, with a $1^{st}$ clock, which is in-phase with the incoming stream of data and is one-half the rate of the incoming stream of data, to produce a $1^{st}$ product. In this instance, the $1^{st}$ product represents missing transitions in the incoming stream of data. The $2^{nd}$ multiplier is operably coupled to multiply the $1^{st}$ product with the incoming data stream to produce a modified stream of data. The phase error generation module is operably coupled to generate a phase error based on the modified stream of data and a $2^{nd}$ clock, where the phase error represents a phase offset between the modified stream of data and the $2^{nd}$ clock.

Another embodiment of a multiplying phase detector includes a $1^{st}$ multiplier, a $2^{nd}$ multiplier and a phase error generation module. In this embodiment, the $1^{st}$ multiplier is operably coupled to multiply an incoming stream of data with a $1^{st}$ clock, which is in-phase with the incoming stream of data and is one-half the rate of the incoming stream of data, to produce a $1^{st}$ product. The $1^{st}$ product represents missing transitions in the incoming stream of data. The $2^{nd}$ multiplier is operably coupled to multiply the $1^{st}$ product with a $2^{nd}$ clock to produce a $2^{nd}$ product. The phase error generation module is operably coupled to generate a phase error based on the stream of data and the $2^{nd}$ product, where the phase error represents a phase offset between the modified stream of data and the $2^{nd}$ clock.

DETAILED DESCRIPTION OF THE INVENTION

Figure 1:
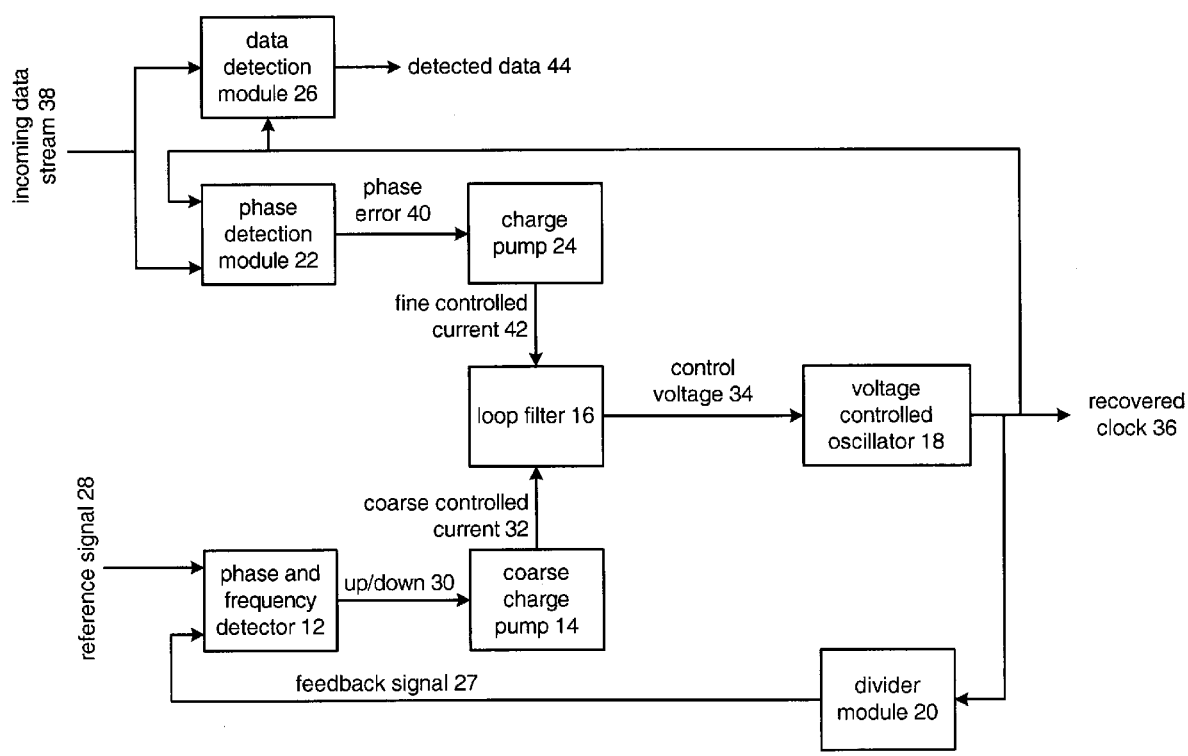
FIG. 1 is a schematic block diagram of a high-speed, wide bandwidth data detection circuit in accordance with the present invention.

FIG. 1 is a schematic block diagram of a high-speed, wide bandwidth data detection circuit 10 that includes a phase and frequency detector 12, a coarse charge pump 14, a loop filter 16, a voltage controlled oscillator 18, a divider module 20, a phase detection module 22, a charge pump 24, and a data detection module 26. In general, the high-speed, wide bandwidth data detection circuit 10 includes a coarse loop and a fine loop. The coarse loop includes the phase and frequency detector 12, coarse charge pump 14, loop filter 16, VCO 18, and divider module 20. The fine loop shares the loop filter 16 and VCO 18 with the coarse loop and further includes charge pump 24, phase detection module 22, and data detection module 26.

In operation, the coarse loop is activated first. In this mode, the phase and frequency detector 12 determines phase and/or frequency differences between a reference signal 28, which may be produced by a crystal oscillator, and a feedback signal 27. Based on the phase and/or frequency differences, the phase and frequency detector 12 generates an up/down signal 30. The phase and/or frequency detector 12 produces the up signal when the phase and/or frequency of the reference signal 28 leads the phase and/or frequency of the feedback signal 27 (i.e., detector 12 is generating the up signal to speed up the coarse loop). In this instance, the output of the VCO 18 is below a desired frequency and, hence, the frequency needs to be increased. Conversely, if the phase and/or frequency of reference signal 28 lags behind the phase and/or frequency of the feedback signal 27, the output of the VCO is at a greater rate than desired, as such, the phase detection circuit 12 produces a down signal to slow down the VCO 18.

The coarse charge pump 14 converts the up/down signal 30 into a coarse controlled current 32. The loop filter 16 converts the coarse controlled current 32 into a control voltage 34. The voltage controlled oscillator 18, based on the control voltage 34, generates an output oscillation. The divider module 20 divides the output oscillation to produce the feedback signal 27.

Once the coarse loop is locked, the coarse charge pump 14 and phase detection circuit 20 are disabled and the phase detection module 22 and charge pump 24 are enabled, thus switching to the fine mode of operation. In this mode, the phase detector module 22 generates a phase error signal 40 based on phase differences between an incoming data stream 38 and a recovered clock 36, which is produced by the VCO 18. The charge pump 24 converts the phase error 40 into a fine-controlled current 42. The loop filter 16 converts the fine-controlled current 42 into the control voltage 34. The VCO 18 converts the control voltage 34 into a recovered clock 36.

The data detection module 26 processes the incoming data stream 38 based on the recovered clock 36 to produce the detected data 44. The phase detection module 22 may be implemented as a multiplying phase detector that may be used in a random data locked loop architecture, such as the data detection circuit illustrated in FIG. 1. In particular, the phase detection module 22 may be implemented as illustrated in FIGS. 2–7.

Figure 2:
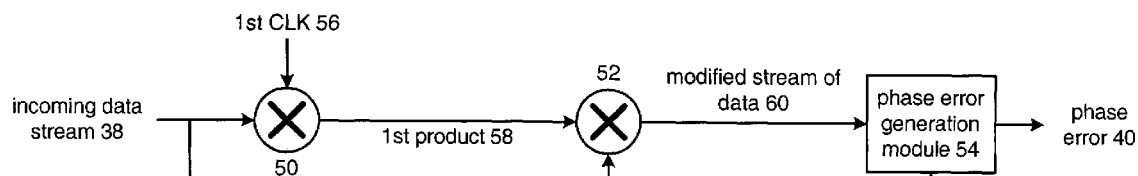
FIG. 2 is a schematic block diagram of a phase detection module in accordance with the present invention.

FIG. 2 is a schematic block diagram of a phase detection module 22 that includes a $1^{st}$ multiplier 50, a $2^{nd}$ multiplier 52 and a phase error generation module 54. The $1^{st}$ multiplier 50 is operably coupled to multiply the incoming data stream 38 with a $1^{st}$ clock signal 56 to produce a $1^{st}$ product 58. The $1^{st}$ clock signal 56 is in-phase with the incoming data stream 38, but is one-half (+/−a few percent) the rate of the incoming data stream 38. This enables the phase detection module 22 to be utilized in a half-rate data detection circuit (e.g., for a 10 Gbps data rate, the clock rate of the first clock is 5 GHz). The $2^{nd}$ multiplier multiplies the incoming data stream 38 with the $1^{st}$ product 58 to produce a modified stream of data 60.

The phase error generation module 54 processes the modified stream of data 60 based on the $2^{nd}$ clock 62 to produce the phase error 40. The $2^{nd}$ clock 62 may correspond to the recovered clock 28, where the $1^{st}$ clock 56 is a 90° phase shifted representation of the recovered clock 36. As such, the $2^{nd}$ clock 62 and $1^{st}$ clock 56 have the same rate but are phase shifted by 90°. Alternatively, the $2^{nd}$ clock 62 may be one-half the rate of recovered clock 36 where the $1^{st}$ clock 56 corresponds to a 45° phase shifted representation of the recovered clock 36. In this instance, the phase detection module 22 may be used in a quarter rate data recovery system.

The phase error generation module 54 may be implemented in a variety of ways. For instance, logic circuitry may be used to compare the phase differences between the modified stream of data and of the $2^{nd}$ clock to produce the phase error 40. Other embodiments of the phase error generation module 54 are illustrated in FIGS. 3 and 4.

Figure 3:
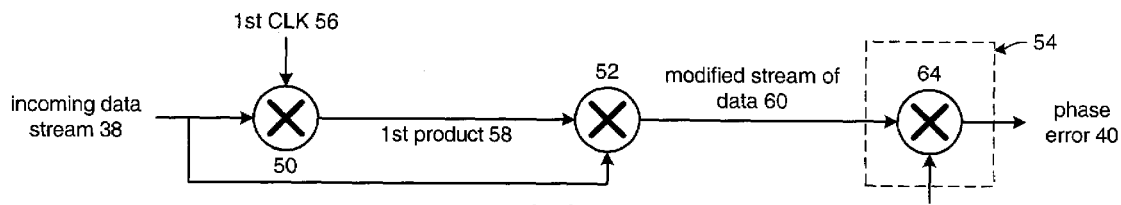
FIG. 3 is a schematic block diagram of another phase detection module in accordance with the present invention.

FIG. 3 is a schematic block diagram of the phase detection module 22 that includes the $1^{st}$ multiplier 50, $2^{nd}$ multiplier 52 and the phase error generation module 54 being implemented as a $3^{rd}$ multiplier 64. As illustrated, the $1^{st}$ multiplier 50 multiplies the incoming data stream 36 with the $1^{st}$ clock signal 56 to produce a $1^{st}$ product 58. The 2 multiplier 52 multiplies the $1^{st}$ product 58 with the incoming data stream 38 to produce a modified stream of data 60. The $3^{rd}$ multiplier 64 multiplies the $2^{nd}$ clock 62 with the modified stream of data 60 to produce the phase error 40. The relationship between the 2 clock 62 and $1^{st}$ clock 56 is as previously described with reference to FIG. 2.

Figure 4:
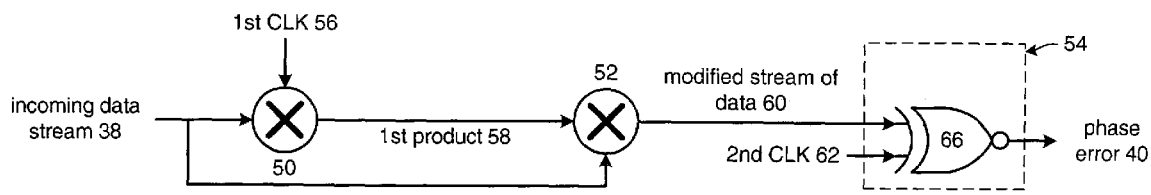
FIG. 4 is a schematic block diagram of yet another phase detection module in accordance with the present invention.

FIG. 4 is another schematic block diagram of the phase detection module 22 that includes the $1^{st}$ multiplier 50, the $2^{nd}$ multiplier 52 and the phase error generation module 54 being implemented as an exclusive OR gate 66. The functionality of the $1^{st}$ and $2^{nd}$ multipliers 50 and 52 are as previously described with reference to FIG. 2 to produce the modified stream of data 60. The exclusive OR gate 66 exclusive ORs the modified stream of data 60 with the $2^{nd}$ clock 62 to produce the phase error 40. The relationship between the $2^{nd}$ clock 62 and $1^{st}$ clock 56 is as previously described with reference to FIG. 2.

Figure 5:
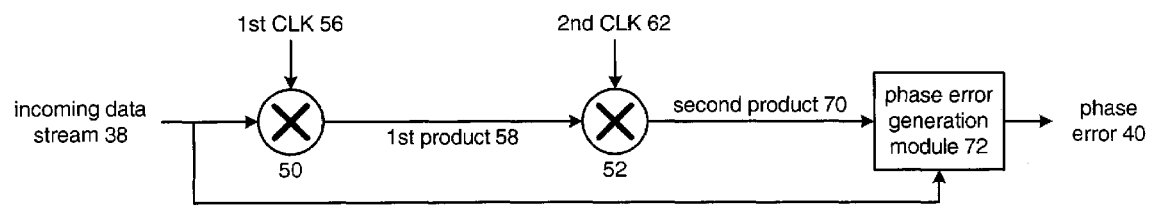
FIG. 5 is a schematic block diagram of a further phase detection module in accordance with the present invention.

FIG. 5 is a schematic block diagram of another embodiment of phase detection module 22 that includes the $1^{st}$ multiplier 50, a $2^{nd}$ multiplier 52 and a phase error generation module 72. In this embodiment, the $1^{st}$ multiplier 50 multiplies the incoming data stream 38 with the $1^{st}$ clock 56 to produce the $1^{st}$ product 58. The $1^{st}$ product 58 represents missing transitions in the incoming stream of data. The $2^{nd}$ multiplier 52 multiplies the $1^{st}$ product 58 with the $2^{nd}$ clock 62 to produce a $2^{nd}$ product 70. The relationship between the $2^{nd}$ clock 62 and $1^{st}$ clock 56 is as previously described with reference to FIG. 2.

The phase error generation module 72 processes the incoming data stream 38 based on the $2^{nd}$ product 70 to produce the phase error 40. The phase error generation module 72 may be implemented as logic circuitry to compare phase differences between the stream of data 38 and the $2^{nd}$ product 70. Alternatively, the phase error generation module 72 may be implemented as shown in FIGS. 6 and 7.

Figure 6:
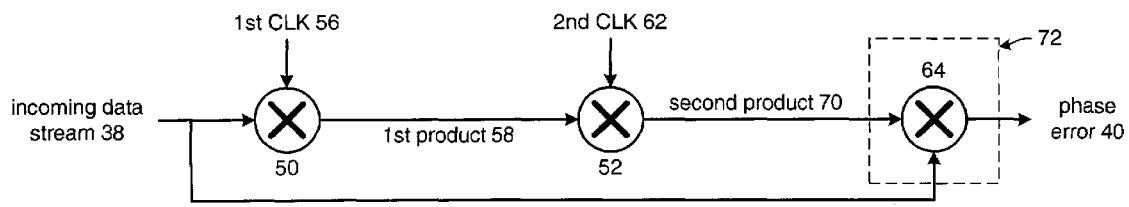
FIG. 6 is a schematic block diagram of yet a further phase detection module in accordance with the present invention.

FIG. 6 illustrates a schematic block diagram of phase detection module 22 that includes the $1^{st}$ multiplier 50, $2^{nd}$ multiplier 52 and a $3^{rd}$ multiplier 64 as the phase error generation module 72. In this embodiment, the $1^{st}$ and $2^{nd}$ multipliers perform as previously described with reference to FIG. 5 to produce the $2^{nd}$ product 70.

Multiplier 64 multiplies the $2^{nd}$ product 70 with the incoming data stream 38 to produce the phase error 40. The relationship between the $2^{nd}$ clock 62 and $1^{st}$ clock 56 is as previously described with reference to FIG. 2.

Figure 7:
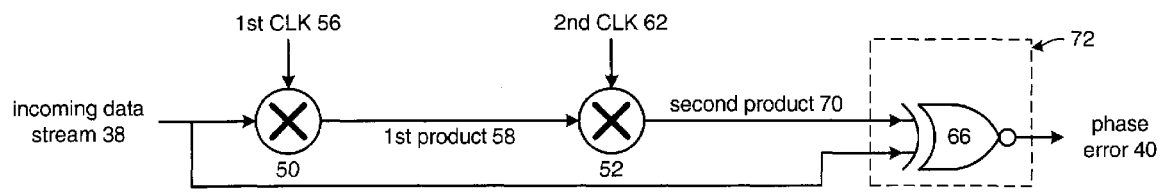
FIG. 7 is a schematic block diagram of a still further embodiment of a phase detection module in accordance with the present invention.

FIG. 7 is a schematic block diagram of phase detection module 22 that includes the $1^{st}$ multiplier 50, the $2^{nd}$ multiplier 52 and an exclusive OR gate 66 as the phase error generation module 72. The $1^{st}$ and $2^{nd}$ multipliers 50 and 52 function as previously described to produce the 2 product 70. The exclusive OR gate 66 exclusive ORs the $2^{nd}$ product 70 with the incoming data stream 38 to produce the phase error 40. The relationship between the $2^{nd}$ clock 62 and $1^{st}$ clock 56 is as previously described with reference to FIG. 2.

Figure 8:
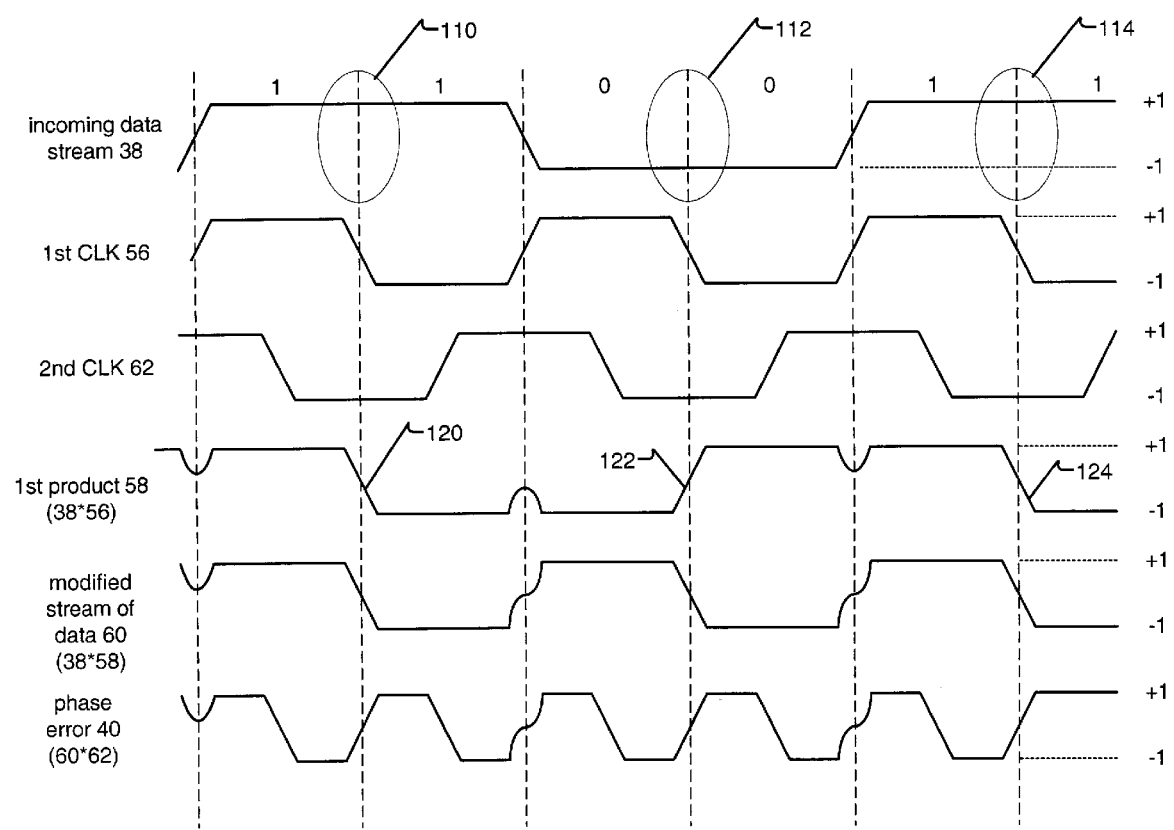
FIG. 8 is a timing diagram of the operation of the phase detectors illustrated in FIGS. 2–4.

FIG. 8 is a timing diagram of the operation of the phase detector modules illustrated in FIGS. 2–4. In this example, the data detection is done in a half-rate manner. Accordingly, the incoming data 38 has a corresponding data bit for each half cycle of the $1^{st}$ clock 56. The $1^{st}$ clock 56 is shown to be in-phase with the incoming data stream 38. The $2^{nd}$ clock 62 is 90° phase shifted in time with respect to the $1^{st}$ clock 56, but maintains the same rate as the $1^{st}$ clock 56. With respect to the data detection circuit of FIG. 1, the $2^{nd}$ clock 62 may be representative of the recovered clock 36 and the $1^{st}$ clock 56 is a 90° phase shifted version thereof. Further, the clock signals 56 and 62 and the incoming data stream 38 are bandwidth limited (e.g., in the range of 2.5 GHz to 5 GHz for a 10 Gbps system). The bandwidth limiting may be achieved by bandwidth limiting the signals prior to be received by the multiplying phase detector or by including filtering within the multiplying phase detector. If the bandwidth limiting is done within the multiplying phase detector, parasitics components and/or additional components may be used to produce a low pass filter (e.g., an LPF with a corner frequency in the range of 2–10 GHz) between the first and second multipliers. An additional filter may be included at the output of phase error generation module using parasitics components and/or additional components to produce a low pass filter (e.g., an LPF with a corner frequency in the range of 100 MHz –1 GHz).

The $1^{st}$ multiplier produces the $1^{st}$ product 58 as a multiplication of the incoming stream of data 38 with the $1^{st}$ clock 56. As shown, the multiplication of the incoming data stream 38 with the $1^{st}$ clock 56 produces transitions of the $1^{st}$ product 58 at each missing transition of the incoming data stream 38. For example, missing transitions are shown in the incoming data stream 38 in circled areas 110, 112, and 114. The corresponding transitions in the $1^{st}$ product 58 are transitions 120, 122, and 124, respectively. Thus the first product represents missing transitions in the incoming stream of data.

The $2^{nd}$ multiplier 52 multiplies the $1^{st}$ product with the incoming data stream 38 to produce the modified stream of data 60. The resulting waveform has clear transitions at each half cycle of the $1^{st}$ clock signal 56. The phase error 40 is produced by a multiplication of the modified stream of data 60 with the $2^{nd}$ clock 62. As shown, the phase error 40 has a rate equal to the incoming data stream 38 and has transitions occurring at every cycle. Thus, even though the incoming data stream produces random patterns of zeros and ones, the phase error 40 is based on the modified stream of data 60 to produce transitions for every clock cycle. Thus, the multiplying phase detector has shown in FIGS. 2–4 overcome the drawbacks of using a multiplying phase detector in a random data locked loop architecture while providing the benefits, i.e., faster speed and lower gain of the overall locked loop architecture (e.g., a data detection and/or clock recovery circuit).

Figure 9:
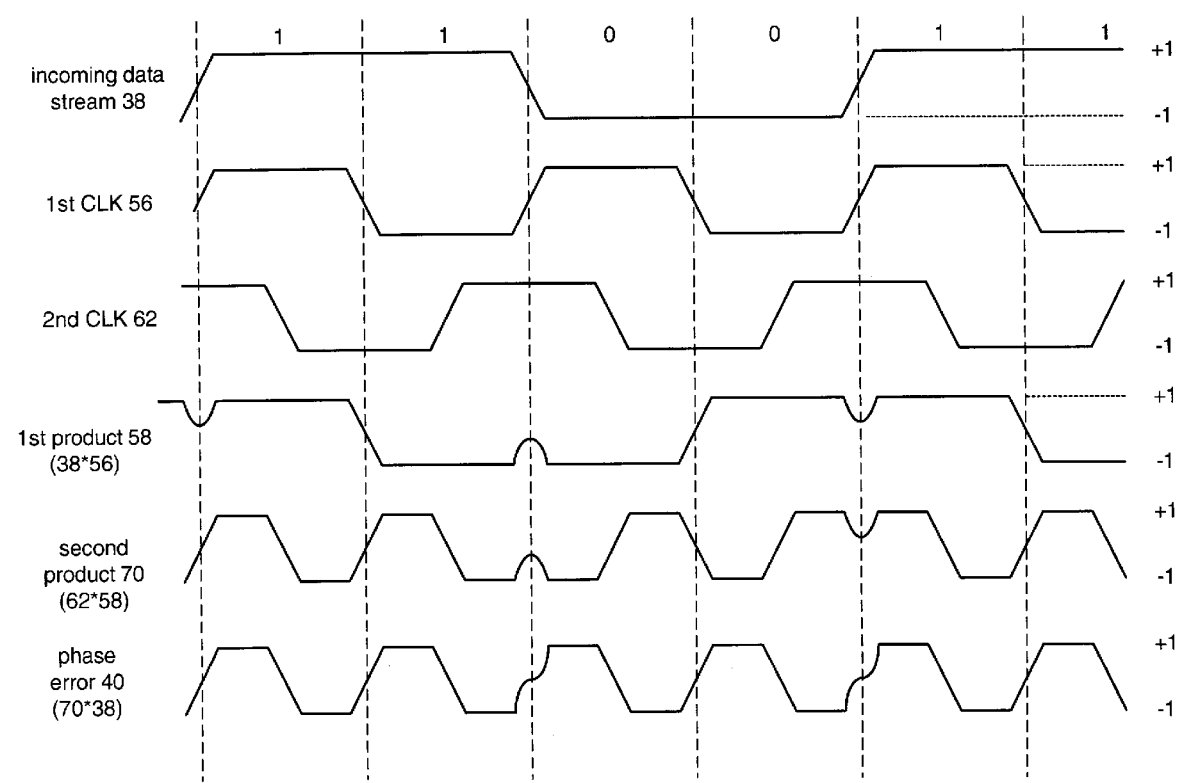
FIG. 9 is a timing diagram of the operation of the phase detectors illustrated in FIGS. 5–7.

FIG. 9 is a timing diagram of the operation of the phase detector modules illustrated in FIGS. 5–7. The incoming data stream 38, $1^{st}$ clock 56, $2^{nd}$ clock 62 and $1^{st}$ product 58 are as previously described with reference to FIG. 8. In this embodiment, the phase detection module, via the $2^{nd}$ multiplier, multiply the $2^{nd}$ clock 62 with the $1^{st}$ product 58 to produce the $2^{nd}$ product 70. The resulting waveform has a clock rate equal to the rate of the incoming data stream 38 and thus has transitions at every clock cycle. The phase error 40 is produced by multiplying the $2^{nd}$ product 70 with the incoming data stream 38 to provide the desired phase error waveform.

The preceding discussion has presented a multiplying phase detector for use in a random data locked loop architecture. By using such a multiplying phase detector in a data detection and/or clock recovery circuit, the data detection and/or clock recovery circuit may operate at higher speeds and require less overall gain than data detection and/or clock recovery circuits that utilize a logic circuit based phase detector. As one of average skill in the art will appreciate, other embodiments may be derived from the teachings of the present invention without deviating from the scope of the claims.

What is claimed is:

1. A multiplying phase detector for use in a random data locked loop architecture, the multiplying phase detector comprises:

first multiplier operably coupled to multiply an incoming stream of data with a first clock to produce a first product, wherein the first product represents missing transitions in the incoming stream of data and wherein the first clock is in phase with the incoming stream of data and is at a rate that is approximately one-half a rate of the incoming stream of data;

second multiplier operably coupled to multiply the first product with the incoming stream of data to produce a modified stream of data; and phase error generation module operably coupled to generate a phase error based on the modified stream of data and a second clock, wherein the phase error represents a phase offset between the modified stream of data and the second clock.

2. The multiplying phase detector of claim 1, wherein the phase error generation module further comprises:

a third multiplier operably coupled to multiply the modified stream of data and the second clock to produce the phase error.

3. The multiplying phase detector of claim 1, wherein the second clock further comprises a clock rate that is substantially equal to a clock rate of the first clock, wherein the second clock is 90 degree phase shifted with respect to the first clock.

4. The multiplying phase detector of claim 1, wherein the second clock further comprises a clock rate that is approximately one-half a clock rate of the first clock.

5. The multiplying phase detector of claim 1, wherein the phase error generator module further comprises:

an exclusive NOR gate operably coupled to exclusively NOR the modified stream of data and the second clock to produce the phase error.

6. The multiplying phase detector of claim 1, wherein the phase error generator module further comprises:

logic circuitry to compare phase differences between the modified stream of data and the second clock to produce the phase error.

7. A multiplying phase detector for use in a random data locked loop architecture, the multiplying phase detector comprises:

first multiplier operably coupled to multiply an incoming stream of data with a first clock to produce a first product, wherein the first product represents missing transitions in the incoming stream of data and wherein the first clock is in phase with the incoming stream of data and is at a rate that is approximately one-half a rate of the incoming stream of data;

second multiplier operably coupled to multiply the first product with a second clock to produce a second product; and phase error generation module operably coupled to generate a phase error based on the stream of data and the second product, wherein the phase error represents a phase offset between the modified stream of data and the second clock.

8. The multiplying phase detector of claim 7, wherein the phase error generation module further comprises:

a third multiplier operably coupled to multiply the stream of data and the second product to produce the phase error.

9. The multiplying phase detector of claim 7, wherein the second clock further comprises a clock rate that is substantially equal to a clock rate of the first clock, wherein the second clock is 90 degree phase shifted with respect to the first clock.

10. The multiplying phase detector of claim 7, wherein the second clock further comprises a clock rate that is approximately one-half a clock rate of the first clock.

11. The multiplying phase detector of claim 7, wherein the phase error generator module further comprises:

an exclusive NOR gate operably coupled to exclusively NOR the stream of data and the second product to produce the phase error.

12. The multiplying phase detector of claim 7, wherein the phase error generator module further comprises:

logic circuitry to compare phase differences between the stream of data and the second product to produce the phase error.

13. A data detection circuit comprises:

phase detection module operably coupled to produce a phase error based on differences between an incoming stream of data and a feedback signal;

data detection module operably coupled to produce detected data based on the incoming stream of data and a recovered clock;

charge pump circuit operably coupled to produce a controlled current based on the phase error;

loop filter operably coupled to convert the controlled current into a control voltage;

voltage controlled oscillator operably coupled to generate the recovered clock based on the control voltage, wherein the feedback signal corresponds to the recovered clock, and wherein the phase detection module includes:

first multiplier operably coupled to multiply the incoming stream of data with the feedback signal to produce a first product, wherein the first product represents missing transitions in the incoming stream of data and wherein the feedback signal is in phase with the incoming stream of data and is at a rate that is approximately one-half a rate of the incoming stream of data;

second multiplier operably coupled to multiply the first product with the incoming stream of data to produce a modified stream of data; and phase error generation module operably coupled to generate the phase error based on the modified stream of data and a second clock, wherein the phase error represents a phase offset between the modified stream of data and the second clock.

14. The data detection circuit of claim 13, wherein the phase error generation module further comprises:

a third multiplier operably coupled to multiply the modified stream of data and the second clock to produce the phase error.

15. The data detection circuit of claim 13, wherein the second clock further comprises a clock rate that is substantially equal to a clock rate of the feedback signal, or wherein the second clock is 90 degree phase shifted with respect to the feedback signal.

16. The data detection circuit of claim 13, wherein the second clock further comprises a clock rate that is approximately one-half a clock rate of the feedback clock.

17. The data detection circuit of claim 13, wherein the phase error generator module further comprises:

an exclusive NOR gate operably coupled to exclusively NOR the modified stream of data and the second clock to produce the phase error.

18. The data detection circuit of claim 13, wherein the phase error generator module further comprises:

logic circuitry to compare phase differences between the modified stream of data and the second clock to produce the phase error.

19. A data detection circuit comprises:

phase detection module operably coupled to produce a phase error based on differences between an incoming stream of data and a feedback signal;

data detection module operably coupled to produce detected data based on the incoming stream of data and a recovered clock;

charge pump circuit operably coupled to produce a controlled current based on the phase error;

loop filter operably coupled to convert the controlled current into a control voltage;

voltage controlled oscillator operably coupled to generate the recovered clock based on the control voltage, wherein the feedback signal corresponds to the recovered clock, and wherein the phase detection module includes:

first multiplier operably coupled to multiply an incoming stream of data with the feedback signal to produce a first product, wherein the first product represents missing transitions in the incoming stream of data and wherein the feedback signal is in phase with the incoming stream of data and is at a rate that is approximately one-half a rate of the incoming stream of data;

second multiplier operably coupled to multiply the first product with a second clock to produce a second product; and phase error generation module operably coupled to generate a phase error based on the stream of data and the second product, wherein the phase error represents a phase offset between the modified stream of data and the second clock.

20. The data detection circuit of claim 19, wherein the phase error generation module further comprises:

a third multiplier operably coupled to multiply the stream of data and the second product to produce the phase error.

21. The data detection circuit of claim 19, wherein the second clock further comprises a clock rate that is substantially equal to a clock rate of the feedback signal, wherein the second clock is 90 degree phase shifted with respect to the feedback signal.

22. The data detection circuit of claim 19, wherein the second clock further comprises a clock rate that is approximately one-half a clock rate of the feedback signal.

23. The data detection circuit of claim 19, wherein the phase error generator module further comprises:

an exclusive NOR gate operably coupled to exclusively NOR the stream of data and the second product to produce the phase error.

24. The data detection circuit of claim 19, wherein the phase error generator module further comprises:

logic circuitry to compare phase differences between the stream of data and the second product to produce the phase error.

* * * * *